United States Patent [19]
Brady

[11] Patent Number: 6,067,263
[45] Date of Patent: May 23, 2000

[54] DYNAMIC RANDOM ACCESS MEMORY CIRCUIT HAVING A TESTING SYSTEM AND METHOD TO DETERMINE THE SENSITIVITY OF A SENSE AMPLIFIER

[75] Inventor: James Brady, Plano, Tex.

[73] Assignee: STMicroelectronics, Inc., Carrollton, Tex.

[21] Appl. No.: 09/287,803

[22] Filed: Apr. 7, 1999

[51] Int. Cl.[7] .................................. G11C 7/00; G11C 7/02
[52] U.S. Cl. .............................................. 365/201; 365/210
[58] Field of Search ..................................... 365/201, 210, 365/203, 205, 207, 208

[56] References Cited

U.S. PATENT DOCUMENTS

| | | |
|---|---|---|
| 5,361,232 | 11/1994 | Petschauer et al. ................. 365/201 |
| 5,428,574 | 6/1995 | Kuo et al. .............................. 365/201 |
| 5,532,963 | 7/1996 | Kushiyama et al. ................. 365/201 |

*Primary Examiner*—Vu A. Le
*Attorney, Agent, or Firm*—Theodore E. Galanthay; Lisa K. Jorgenson; Andre M. Szuwalski

[57] ABSTRACT

A dynamic random access memory (DRAM) circuit is provided that utilizes a testing system and method to determine the sensitivity of a sense amplifier. More specifically, the DRAM circuit, in determining the sensitivity of the sense amplifier, utilizes a testing system to independently control the magnitude of a voltage differential appearing between a pair of bit lines and sensed by the sense amplifier. The sensitivity of the sense amplifier is then able to be determined by monitoring an input/output signal in response to sensing the known voltage differential. The testing system controls the magnitude of the voltage differential appearing between the bit lines by enabling a first dummy cell to transfer a first reference charge onto a first bit line and by enabling a second dummy cell to transfer a second reference charge onto a second bit line.

21 Claims, 3 Drawing Sheets

DYNAMIC RANDOM ACCESS MEMORY CIRCUIT HAVING A TESTING SYSTEM AND METHOD TO DETERMINE THE SENSITIVITY OF A SENSE AMPLIFIER

BACKGROUND OF THE INVENTION

1. Technical Field of the Invention

The present invention generally relates to semiconductor memory circuits and, in particular, to a dynamic random access memory (DRAM) circuit having a testing system and method to determine the sensitivity of a sense amplifier.

2. Description of Related Art

It is well known that a computer system requires memory to store data regardless of whether the computer system is a large machine or a microcomputer. The computer system can use a type of memory known as semiconductor memory to store data in either non-volatile memory or volatile memory.

Semiconductor memory that loses data upon removal of a power supply is volatile memory and can be further classified as Static Random Access Memory (SRAM) or Dynamic Random Access Memory (DRAM). Static Random Access Memory includes a flip-flop and multiple transistors that maintain a bit of data so long as power is present. Dynamic Random Access Memory, on the other hand, includes a memory cell that has a transistor and storage capacitor to maintain a charge representing a bit of data for a short period of time unless the memory cell is periodically refreshed.

The DRAM also includes a sense amplifier for sensing a voltage differential that appears between a first bit line and second bit line during a read operation of the memory cell. The sense amplifier determines a binary value of the data represented by the charge maintained in the memory cell by comparing a voltage level corresponding to the charge of the memory cell that is transferred to the first bit line to that of a precharge voltage (e.g., Vdd/2) present on the second bit line. However, since the voltage level within the storage capacitor of the memory cell decays towards ground, the detection of a "high" binary value by the sense amplifier becomes more difficult as the voltage level within the storage capacitor decays closer to the precharge voltage.

In addressing the decaying problem of the storage capacitor, DRAM circuit currently uses a dummy cell to aid the sense amplifier in detecting the "high" binary values by setting a dummy voltage within the dummy cell to a level below the conventional precharged voltage of Vdd/2 and comparing the dummy voltage instead of the conventional precharge voltage to the voltage level of the memory cell. The utilization of the dummy voltage set below the traditional precharge voltage increases the margin for detecting the "high" binary value of the memory cell, at the expense of a corresponding decrease in the margin for detecting a "low" binary value of the memory cell.

Unfortunately, the current use of the dummy cell to increase the margin for detecting the "high" binary value within the memory cell fails to address a problem where the sense amplifier itself may be defective. For instance, the sense amplifier may not have sufficient sensitivity to correctly identify the binary value or voltage level of the memory cell regardless of the setting of the margins. Therefore, there is a need for a dynamic random access memory (DRAM) circuit incorporating a testing system and method used to determine the sensitivity of a sense amplifier.

SUMMARY OF THE INVENTION

The present invention is a dynamic random access memory (DRAM) circuit having a testing system and method that determines the sensitivity of a sense amplifier. More specifically, the DRAM circuit in determining the sensitivity of the sense amplifier utilizes a testing system to independently control the magnitude of a voltage differential appearing between a pair of bit lines and sensed by the sense amplifier. The sensitivity of the sense amplifier is then able to be determined by monitoring an input/output signal generated by the sense amplifier in response to sensing the known voltage differential. The testing system controls the magnitude of the voltage differential appearing between the bit lines by enabling a first dummy cell to transfer a first reference charge onto a first bit line and by enabling a second dummy cell to transfer a second reference charge onto a second bit line.

In accordance with the present invention, there is provided a method and DRAM circuit operable during a test mode to determine the sensitivity of a sense amplifier and operable during a normal mode to determine a binary value of a stored charge in a memory cell.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

Figure 1:
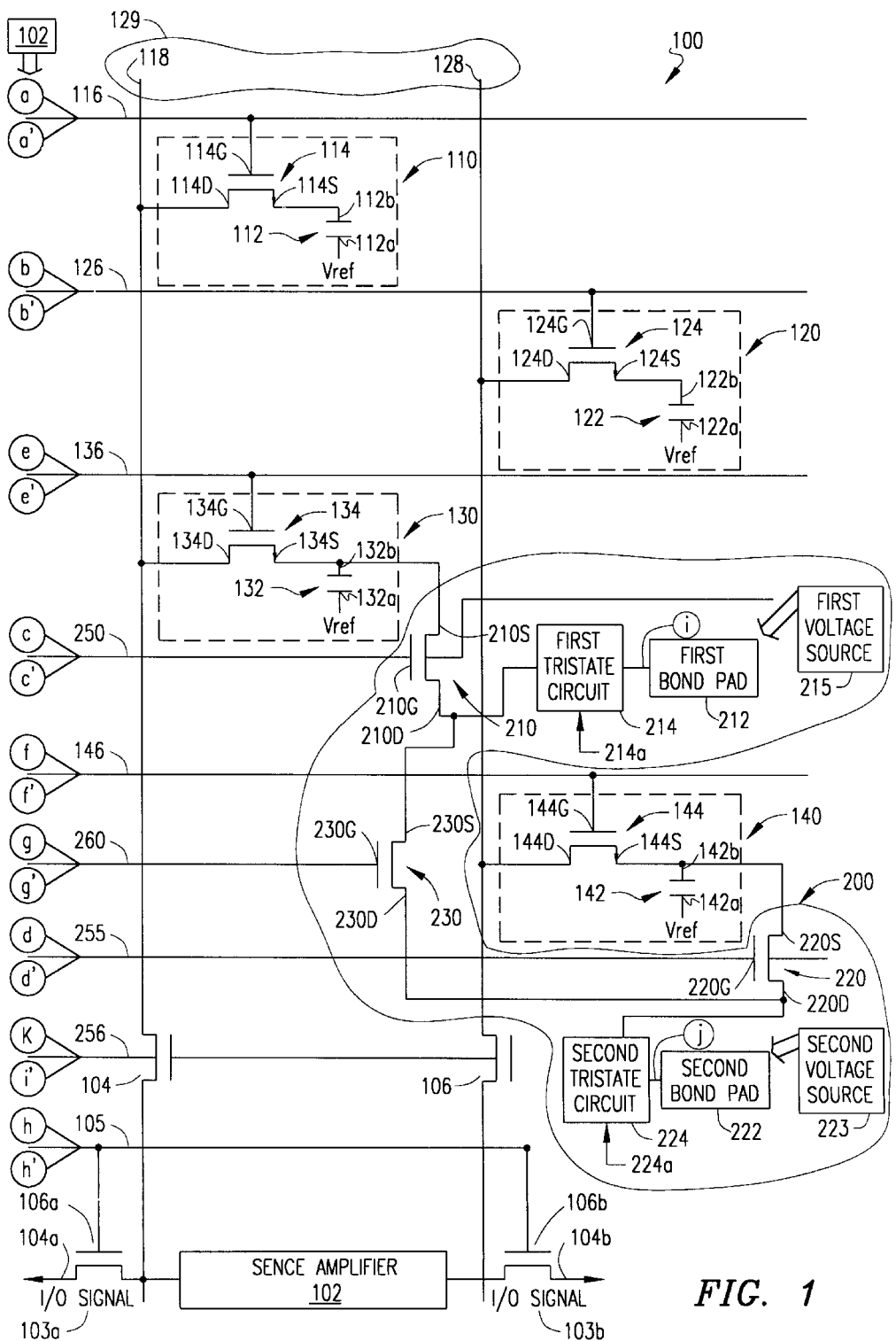
FIG. 1 is a circuit diagram illustrating a DRAM circuit incorporating a testing system used to determine the sensitivity of a sense amplifier in accordance with the present invention.
Figure 2:
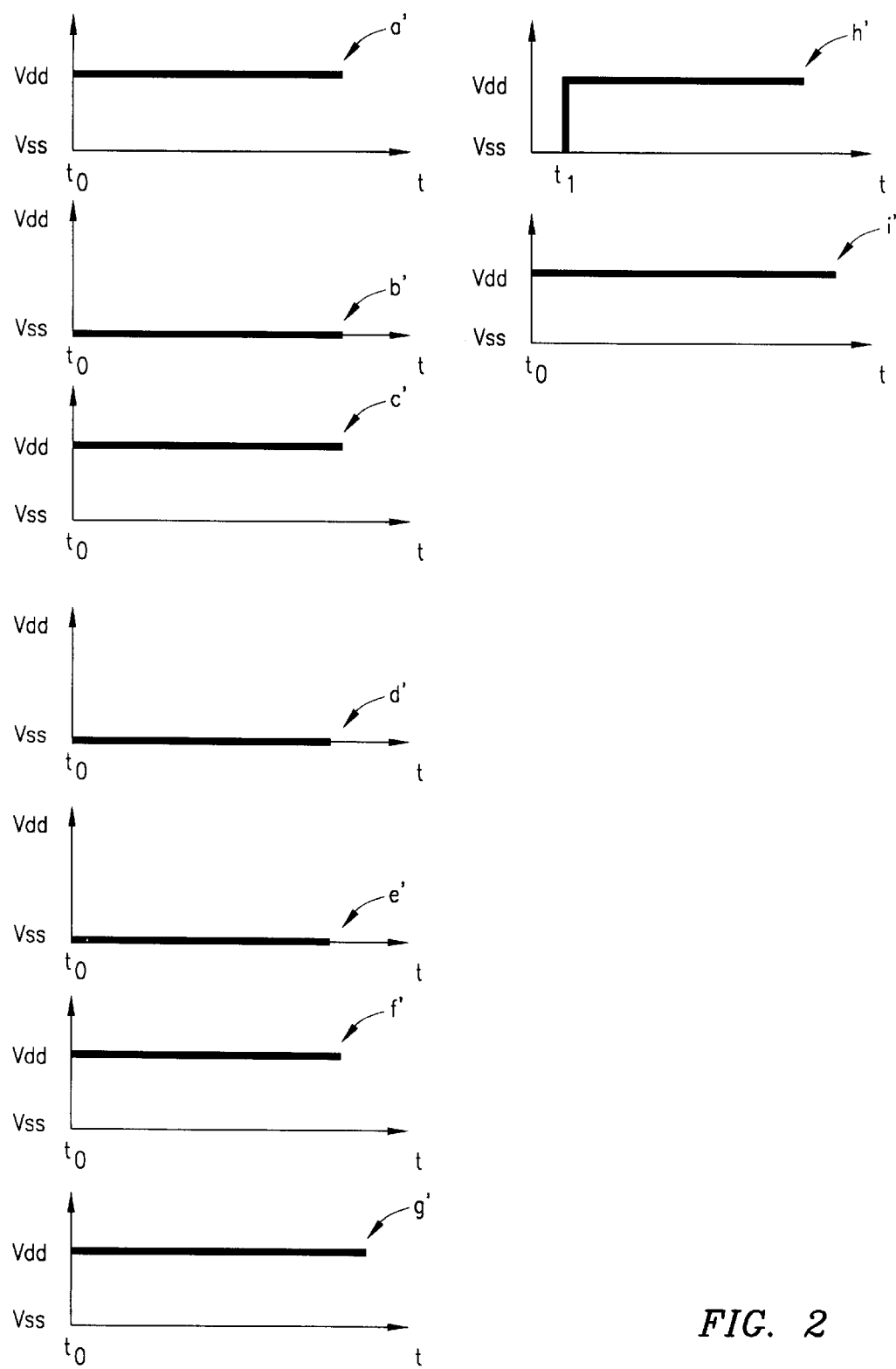
FIG. 2 is a diagram illustrating voltage waveforms at certain locations in the DRAM circuit of FIG. 1 during a normal mode of operation.
Figure 3:
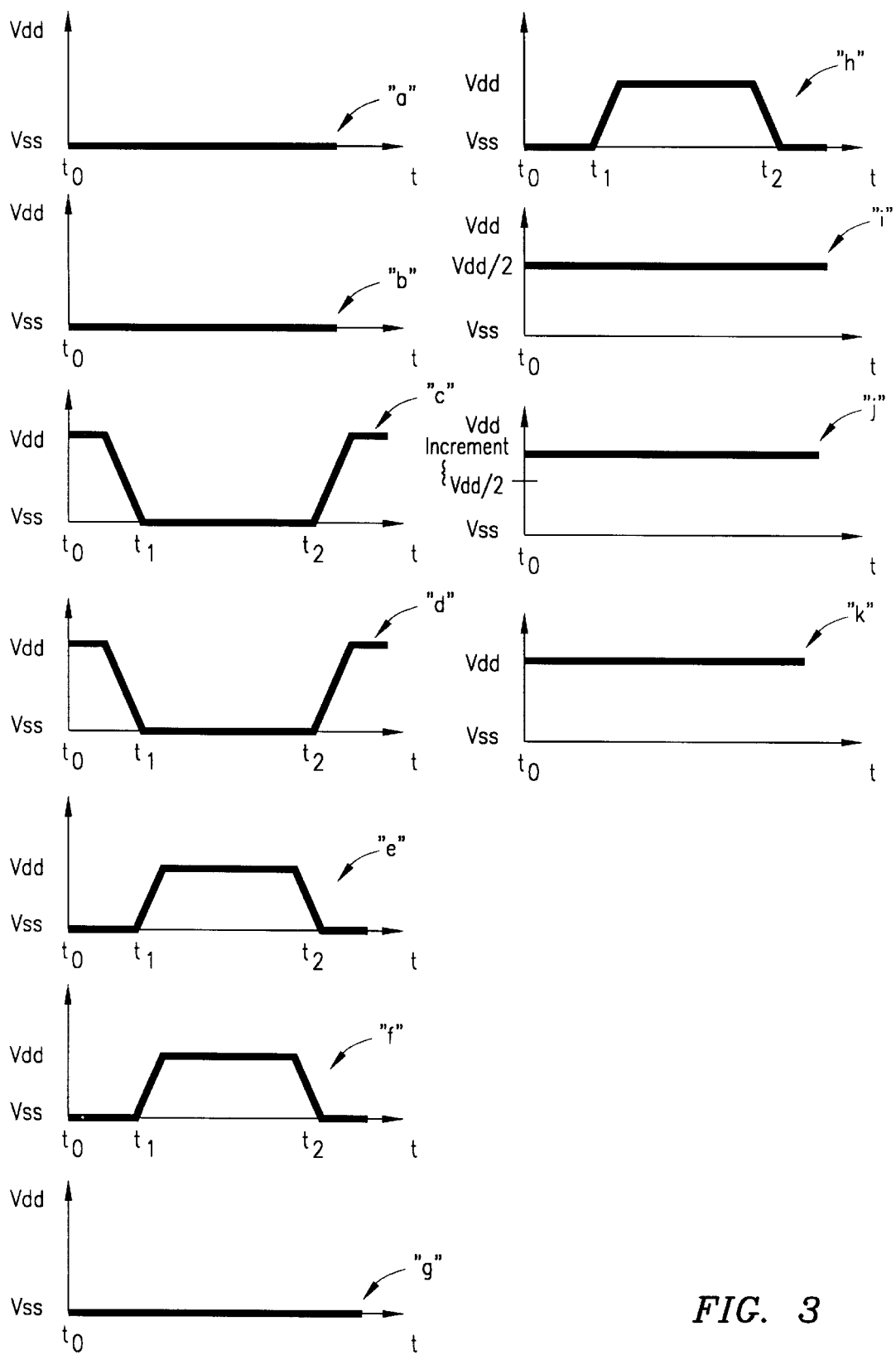
FIG. 3 is a diagram illustrating voltage waveforms at certain locations in the DRAM circuit of FIG. 1 during a test mode of operation.

Referring to the Drawings, wherein like numerals represent like parts throughout FIGS. 1–3, there is disclosed an exemplary Dynamic Random Access Memory (DRAM) circuit 100 incorporating a testing system 200 used to determine the sensitivity of a sense amplifier 102 in accordance with the present invention.

Although the DRAM circuit 100 will be described without reference to any particular semiconductor chips, it should be understood that the present invention can be used within stand-alone memory chips but is especially suited for use as memory embedded within an integrated circuit such as a microprocessor chip or an application specific integrated circuit (ASIC). Accordingly, the DRAM circuit 100 described should not be construed in such a limited manner.

Referring to FIG. 1, there is a circuit diagram illustrating the DRAM circuit 100 incorporating the testing system 200 used to determine the sensitivity of the sense amplifier 102. For clarity, only a representative portion of the DRAM circuit 100 including (for example) a pair of memory cells 110 and 120, a pair of dummy cells 130 and 140 and a pair 129 of bit lines are described and illustrated. However, it should be understood that the DRAM circuit in practice includes a very large number of such elements.

The DRAM circuit 100 preferably employs a single transistor memory architecture where the first memory cell 110 includes a storage capacitor 112 and an access transistor 114. The storage capacitor 112 has a first terminal 112a connected to a reference voltage Vref (e.g., Vdd/2) and a second terminal 112b connected to a source node 114S of the access transistor 114. The access transistor 114 also includes a gate node 114G connected to a first word line 116 and a drain node 114D connected to a first bit line 118 of the pair 129. The first memory cell 110 operates to transfer a first memory charge stored within the storage capacitor 112 to the first bit line 118 when a "thigh" voltage is applied to the first word line 116.

Moreover, the DRAM circuit 100 includes the second memory cell 120 incorporating a storage capacitor 122 and an access transistor 124. The storage capacitor 122 has a first terminal 122a connected to the reference voltage and a second terminal 122b connected to a source node 124S of the access transistor 124. The access transistor 124 also includes a gate node 124G connected to a second word line 126 and a drain node 124D connected to a second bit line 128 of the pair 129. The second memory cell 120 operates to transfer a second memory charge stored within the storage capacitor 122 to the second bit line 128 when a "high" voltage is applied to the second word line 126.

The first memory cell 110 and second memory cell 120 each operate to store data in the form of a charge within the respective storage capacitors 112 and 122. The charge can be at or near Vdd (high voltage) which is representative of a binary value "1", or the charge can be at or near Vss (low voltage) which is representative of a binary value "0". In addition, the charge within the first memory cell 110 can be referred to as the first memory charge regardless of the binary value and, likewise, the charge within the second memory cell 120 can be referred to as the second memory charge regardless of the binary value.

The DRAM circuit 100 further includes the first dummy cell 130 having a storage capacitor 132 and an access transistor 134. The storage capacitor 132 has a first terminal 132a connected to the reference voltage and a second terminal 132b connected to a source node 134S of the access transistor 134. The access transistor 134 also includes a gate node 134G connected to a first dummy word line 136 and a drain node 134D connected to the first bit line 118 of the pair 129. The first dummy cell 130 operates to transfer a first dummy charge stored within the storage capacitor 132 to the first bit line 118 when a "high" voltage is applied to the first dummy word line 136.

Moreover, the DRAM circuit 100 also includes the second dummy cell 140 having a storage capacitor 142 and an access transistor 144. The storage capacitor 142 has a first terminal 142a connected to the reference voltage and a second terminal 142b connected to a source node 144S of the access transistor 144. The access transistor 144 also includes a gate node 144G connected to a second dummy word line 146 and a drain node 144D connected to the second bit line 128 of the pair 129. The second dummy cell 140 operates to transfer a second dummy charge stored within the storage capacitor 142 to the second bit line 128 when a "high" voltage is applied to the second dummy word line 146.

The sense amplifier 102 incorporated within the DRAM circuit 100 generally includes cross-coupled invertors that operate to sense a small change in potential or the voltage differential appearing between the first bit line 118 and the second bit line 128. In response to sensing the voltage differential, the sense amplifier 102 drives the pair of bit lines 129 to different voltage levels based on the sensed voltage differential. Input/output signals 103a and 103b (one I/O signal is permissible) corresponding to the different voltage levels present on the bit line pair 129 are then read from input/output lines 104a and 104b by enabling an I/O control line 105 to actuate output transistors 106a and 106b, respectively.

The sense amplifier 102 may also be connected to the first bit line 118 by way of a first pass gate 104, and connected to the second bit line 128 by way of a second pass gate 106. A gate node of the first pass gate 104 and the second pass gate 106 are connected to a block isolation line 256. The first and second pass gates 104 and 106 (e.g., transmission gates) function to help facilitate the sensing and driving operation of the sense amplifier 102 by passing the voltage differential present on the bit lines 129 to the sense amplifier 102.

During a normal mode of operation, the testing circuit 200 (described below) is deactivated such that the DRAM circuit 100 can function to read and write data to and from the memory cells 110 and 120 in a conventional manner (see FIG. 2 for a detailed discussion).

During the test mode of operation, the sense amplifier 102 operates to sense the voltage differential appearing between the bit line pair 129, and the input/output signals 103a and 103b are monitored to determine the sensitivity of the sense amplifier. More particularly, the sensitivity of the sense amplifier 102 is determined by activating the testing circuit 200 so as to independently control the magnitude of the sensed voltage differential by enabling the first dummy cell 130 to transfer a first reference charge onto the first bit line 118 and enabling the second dummy cell 140 to transfer the second reference charge onto the second bit line 128 during which none of the memory cells 110 and 120 are accessed (see FIG. 3 for a detailed discussion).

The testing circuit 200 includes a first transistor 210 (see FIGS. 2 and 3 for an operational description) having a source node 210S coupled to the second terminal 132b of the first dummy cell 130, and a gate node 210G connected to a first dummy reference word line 250. The first transistor 210 also includes a drain node 210D connected to a first bond pad 212 by way of a first tristate circuit 214. During the test mode, the first bond pad 212 enables a first voltage source 215 to charge the charging capacitor 132 of the first dummy cell 130 to the predetermined first reference charge which is transferred to the first bit line 118 as described in FIG. 3 when a "high" voltage is applied to the first dummy reference word line 250.

Likewise, the testing circuit 200 also includes a second transistor 220 (see FIGS. 2 and 3 for an operational description) having a source node 220S coupled to the second terminal 142b of the second dummy cell 140, and a gate node 220G connected to a second dummy reference word line 255. The second transistor 220 also includes a drain node 220D connected to a second bond pad 222 by way of a second tristate circuit 224. During the test mode, the second bond pad 222 enables a second voltage source 223 to charge the charging capacitor 142 of the second dummy cell 140 to the predetermined second reference charge which is transferred to the second bit line 128 as described in FIG. 3 when a "high" voltage is applied to the second dummy reference word line 255.

It should be understood that the first voltage source 215 and the second voltage source 223 can be obtained from tester probes from integrated circuit test equipment or other voltage sources external to the chip.

In addition, the first and second tristate circuits 214 and 224 can also include a test control input 214a and 224a for selectively coupling the first and second bond pads 212 and 222 to the transistors 210 and 230 during the test mode, and selectively isolating the bond pads from the transistors 210 and 230 during the normal mode. Test control signals associated with the test control inputs 214a and 224a can be directly controlled at the chip level so that memory can be quickly configured for the test mode and normal mode. The test control signals may be incorporated with built-in self-test (BIST) signals and circuitry to fully test the DRAM circuit 100.

The testing circuit 200 further includes a shorting transistor 230 that has a gate node 230G connected to a shorting gate line 260, and a source node 230S and a drain node 230D respectively connected to the drain node 210D of the first transistor 210 and the drain node 220D of the second transistor 220. The shorting transistor 230 is controlled (see FIGS. 2 and 3) so that the first bond pad 212 and the second bond pad 224 are electrically isolated during the test mode and shorted to one another during the normal mode.

Moreover, timing circuitry 102 may utilize, for example, memory control signals, row address decode signals, DRAM read/write signals, and control signals (see the waveforms illustrated in FIGS. 2 and 3) to provide the necessary control over the DRAM circuit 100.

Referring to FIG. 2, there is illustrated a plurality of voltage waveforms a' through h' that can be applied to the DRAM circuit 100 during the normal mode. For clarity, the particular locations (e.g., word line 116) within the DRAM circuit 100 of FIG. 1 where the voltage waveforms (e.g., waveform a') are applied have been labeled with a corresponding alphanumeric.

During the normal mode, the testing circuit 200 is deactivated so that the DRAM circuit 100 can conduct read and write operations of the memory cells 110 and 120. For example, the read operation can occur when the first memory cell 110 is enabled to transfer the first memory charge to the first bit line 118 and the second dummy cell 140 is enabled to transfer a dummy reference charge (e.g., slightly less than Vdd/2) to the second bit line 128 (this particular read operation is described in detail below). Or in the alternative, the second memory cell 120 is enabled to transfer the second memory charge to the second bit line 128 and the first dummy cell 130 is enabled to transfer a dummy reference charge to the first bit line 118 (this particular read operation is not described below). The sense amplifier 102 then senses the "small" change in potential appearing on the bit line pair 129 following the read operation and drives the bit lines 118 and 128 to the appropriate full reference voltage level, such as Vdd or Vss. Thereafter, the I/O signals 103a and 103b are monitored to determine the binary value stored within the respective memory cell 110 or 120.

More specifically, the first memory cell 110 transfers the first memory charge to the first bit line 118 because a high voltage represented by waveform a' is applied at "$t_0$" to the first word line 116. Whereas, the second memory cell 120 does not transfer the second memory charge to the second bit line 128 because a low voltage represented by waveform b' is applied at "$t_0$" to the second word line 126.

At the same time the first memory charge is transferred to the first bit line 118, the second dummy cell 140 transfers the dummy reference charge to the second bit line 128 because a high voltage represented by waveform f' is applied at "$t_0$" to the second dummy word line 146. The first dummy cell 130 does not transfer the dummy reference charge to the first bit line 118 because a low voltage represented by waveform e' is applied at "$t_0$" to the first dummy word line 136.

Prior to the transfer of the first memory charge, the testing circuit 200 is effectively disabled by applying at "$t_0$" a high voltage represented by waveform g' to the shorting gate line 260 to activate the shorting transistor 230 so that the first and second dummy reference charges are at the same potential. Also, during the read operation the first transistor 210 may be activated by the application at "$t_0$" of a high voltage represented by waveform c' to the first dummy referenced word line 250, and the second transistor 220 can be deactivated by the application at "$t_0$" of a low voltage represented by waveform d' to the second dummy reference word line 260. It should be understood that the testing system 200 can be disabled during the normal mode in many different ways and the above-mentioned description describes only one such way.

The pass gates 104 and 106 are activated by the application at "$t_0$" of a high voltage represented by wave form i' to the block isolation line 256. Activation of the pass gates 104 and 106 enables the bit line voltage/charge to pass through to the sense amplifier 102. The bit lines 129 are then driven to different voltages and the I/O signals 104a and 104b may be activated to output the driven voltages.

The sense amplifier 102 operates to sense the voltage differential appearing across the bit line pair 129, and the I/O signals 103a and 103b corresponding to the binary value stored within the memory cell 110 are output by the application at "$t_1$" of a high voltage represented by waveform h' onto the I/O control line 105.

Referring to FIG. 3, there is illustrated a plurality of voltage waveforms "a" through "k" that can be applied to the DRAM circuit 100 during the test mode. It should be understood that the waveforms "a" through "k" are applied in a similar manner and to the corresponding locations within the DRAM circuit 100 as were the waveforms a' through i' represented in FIG. 2.

During the test mode, the DRAM circuit 100 is enabled so that the voltage differential appearing between the bit line pair 129 is independently controlled by off-chip test equipment (for example) that activate the first dummy cell 130 to transfer the first reference charge onto the first bit line 118 and activating the second dummy cell 140 to transfer the second reference charge onto the second bit line 128 during which time the first and second memory cells 110 and 120 are not accessed. In such a situation, the sensitivity of the sense amplifier 102 can be determined by independently controlling the magnitudes of the first and second reference voltages, allowing the sense amplifier 102 to sense the voltage differential between the bit line pair 129, and by monitoring the I/O signals 103a and 103b in response to sensing the applied voltage differential. It should be understood that the bit lines 118 and 128 are typically precharged and equalized to a voltage (e.g., Vdd/2) prior to the test mode.

More specifically, the first memory cell 110 does not transfer the first memory charge to the first bit line 118 because a low voltage (e.g., Vss) represented by waveform "a" is applied at "$t_0$" to the first word line 116. Likewise, the second memory cell 120 does not transfer the second memory charge to the second bit line 128 because a low voltage represented by waveform "b" is applied at "$t_0$" to the second word line 126.

The first voltage source 215 (FIG. 1) is connected to the first bond pad 212 during the test mode to charge the charging capacitor 132 of the first dummy cell 130 at "$t_0$" to the first reference charge (e.g., Vdd/2) represented by waveform "i". It should be understood that the first reference charge can be any voltage level that is capable of being stored by the storage capacitor 132. The first dummy cell 130 is charged to the first reference charge in the first place because the first transistor 210 is activated for a short period of time by applying at "$t_0$" a high voltage represented by waveform "c" to the first dummy reference word line 250.

Likewise, the second voltage source 223 is connected to the second bond pad 222 during the test mode to charge the charging capacitor 142 of the second dummy cell 140 at "$t_0$" to the second reference charge (e.g., Vdd/2 plus or minus a "value") represented by waveform "j". The second reference charge can be any voltage level that is capable of being stored by the storage capacitor 142. The second dummy cell 140 is charged to the second reference charge because the second transistor 220 is activated for a short period of time by applying at "$t_0$" a high voltage represented by waveform "d" to the second dummy reference word line 255.

The "value" component of the second reference charge (Vdd/2 plus or minus a "value") is the charge used to determine the sensitivity of the sense amplifier 102. If the sense amplifier 102 is not able to detect the change in potential between the bit line corresponding to the increment component, then the sense amplifier may lack sensitivity.

Thereafter, the first dummy cell 130 is activated by applying at "$t_1$–$t_2$" a high voltage represented by waveform "e" to the first dummy word line 136 so that the first reference charge is transferred to the first bit line 118. And, the second dummy cell 140 is activated by applying at "$t_1$–$t_2$" a high voltage represented by waveform "f" to the second dummy word line 146 so that the second reference charge is transferred to the second bit line 128.

The pass gates 104 and 106 are activated by the application at "$t_0$" of a high voltage represented by wave form "k" to the block isolation line 256. Activation of the pass gates 104 and 106 enables the bit line voltage/charge to pass through to the sense amplifier 102. The bit lines 129 are then driven to different voltages and the I/O signals 104a and 104b may be activated to output the driven voltages.

Thereafter, the sense amplifier 102 operates to sense the voltage differential (e.g., the increment component) appearing across the bit line pair 129, and the I/O signals 103a and 103b are used to determine whether the sense amplifier correctly sensed the applied voltage differential. The I/O signals 103a and 103b are able to be monitored and read by the application at "$t_1$–$t_2$" of a high voltage represented by waveform h' onto the I/O control line 105. In the event where the increment sized to be sensed by a functioning sense amplifier is placed in the second dummy memory cell 140, then the sense amplifier 102 if able should drive the second bit line 128 to "Vdd" (logic 1) which is output from I/O line 103b, otherwise, if "Vss" (logic 0) is output from I/O line 103b then the sense amplifier is not sensitive enough to detect the increment component.

Also during the test mode, the shorting transistor 230 has a low voltage (represented by waveform "g") applied at "$t_0$" to the shorting gate line 260 so that the first bond pad 212 and the second bond pad 222 are not shorted to one another as they are during the normal mode.

The testing procedure is repetitive in that if the sense amplifier 102 indicates a successful sensing, a new set of charges (e.g., first and second reference charges) having a different incremental value are applied to the dummy cells 130 and 140 and transferred to the bit line pair 129 so that the sensitivity of the sense amplifier can again be tested through an entire range of values.

From the foregoing, it can be readily appreciated by those skilled in the art that the present invention provides a method and DRAM circuit that uses two dummy cells to independently control the voltage levels sensed by a sense amplifier in determining the sensitivity of the sense amplifier. Also, the DRAM circuit as disclosed may operate in a test mode when determining the sensitivity of a sense amplifier or in a normal mode when determining a binary value of a stored charge in a memory cell.

Although one embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A dynamic random access memory circuit including a first memory cell and a first dummy cell coupled to a first bit line, a second memory cell and a second dummy cell coupled to a second bit line, and a sense amplifier for sensing a voltage differential appearing between the first bit line and the second bit line, said dynamic random access memory circuit comprising:

a testing system operable to test the sensitivity of said sense amplifier by independently controlling the voltage differential appearing between the first bit line and the second bit line and by monitoring at least one input/output signal in response to sensing the voltage differential, wherein said testing system independently controls the voltage differential appearing between the first bit line and the second bit line by enabling the first dummy cell to transfer a predetermined first reference charge onto the first bit line and by enabling the second dummy cell to transfer a predetermined second reference charge onto the second bit line during which said first and second memory cells are disabled.

2. The dynamic random access memory circuit of claim 1, wherein said testing system further includes a first bond pad for enabling application of the predetermined first reference charge to said first dummy cell and a second bond pad for enabling application of the predetermined second reference charge to said second dummy cell.

3. The dynamic random access memory circuit of claim 2, wherein said testing system further includes a first voltage source connected to said first bond pad for charging a storage capacitor of said first dummy cell to the predetermined first reference charge.

4. The dynamic random access memory circuit of claim 2, wherein said testing system further includes a second voltage source connected to said second bond pad for charging a storage capacitor of said second dummy cell to the predetermined second reference voltage.

5. The dynamic random access memory circuit of claim 2, wherein said testing system further includes a first transistor located between the first dummy cell and the first bond pad, and a second transistor located between the second dummy cell and the second bond pad, wherein said first transistor is turned off prior to enabling said first dummy cell to transfer the predetermined first reference charge to the first bit line and said second transistor is turned off prior to enabling said second dummy cell to transfer the predetermined second reference charge to the second bit line.

6. The dynamic random access memory circuit of claim 5, wherein said testing system further includes a first tristate device operable to electrically connect the first bond pad and the first transistor during a test mode, and a second tristate device operable to electrically connect the second bond pad and the second transistor during the test mode.

7. The dynamic random access memory circuit of claim 5, wherein said testing system further includes a shorting transistor operable to electrically isolate the first transistor and the second transistor during a test mode and operable to electronically short the first transistor and the second transistor during a normal mode.

8. A dynamic random access memory circuit capable of operating in either a test mode or a normal mode, said dynamic random access memory circuit comprising:
    a first memory cell and a first dummy cell coupled to a first bit line;
    a second memory cell and a second dummy cell coupled to a second bit line; and
    a sense amplifier for sensing a voltage differential appearing between the first bit line and the second bit line and output a signal indicative of the sensed voltage differential:
        wherein during the normal mode said first memory cell is selectively enabled to transfer a first memory charge onto the first bit line and said second memory cell is selectively enabled to transfer a second memory charge onto the second bit line, and the output signal provides a logic level relating to the transferred memory charge; and
        wherein during the test mode said first dummy cell is selectively enabled to transfer a predetermined first reference charge onto the first bit line and said second dummy cell is simultaneously selectively enabled to transfer a predetermined second reference charge, different from the first reference charge by an increment onto the second bit line, and the output signal provides a logic level relating to a sensitivity of the sense amplifier to detect the increment to determine the sensitivity of said sense amplifier by independently controlling the voltage differential appearing between the first bit line and the second bit line and by monitoring at least one input/output signal generated by the sense amplifier in response to sensing the voltage differential, said testing system independently controls the voltage differential appearing between the first bit line and the second bit line during which said first and second memory cells are not enabled.

9. The dynamic random access memory circuit of claim 8, wherein said testing system further includes a first bond pad for enabling application of the predetermined first reference charge to said first dummy cell and a second bond pad for enabling application of the predetermined second reference charge to said second dummy cell.

10. The dynamic random access memory circuit of claim 9, wherein said testing system further includes a first voltage source connected to said first bond pad for charging a storage capacitor of said first dummy cell to the predetermined first reference charge.

11. The dynamic random access memory circuit of claim 9, wherein said testing system further includes a second voltage source connected to said second bond pad for charging a storage capacitor of said second dummy cell to the predetermined second reference charge.

12. The dynamic random access memory circuit of claim 9, wherein said testing system further includes a first transistor located between the first dummy cell and the first bond pad, and a second transistor located between the second dummy cell and the second bond pad, wherein said first transistor is turned off prior to enabling said first dummy cell to transfer the predetermined first reference charge to the first bit line and said second transistor is turned off prior to enabling said second dummy cell to transfer the predetermined second reference charge to the second bit line.

13. The dynamic random access memory circuit of claim 12, wherein said testing system further includes a first tristate device operable to electrically connect the first bond pad and the first transistor during the test mode, and a second tristate device operable to electrically connect the second bond pad and the second transistor during the test mode.

14. The dynamic random access memory circuit of claim 12, wherein said testing system further includes a shorting transistor operable to electrically isolate the first transistor and the second transistor during the test mode and operable to electrically short the first transistor and the second transistor during the normal mode.

15. A method for determining the sensitivity of a sense amplifier located within a dynamic random access memory circuit including a first dummy cell and first memory cell coupled to a first bit line, and a second dummy cell and second memory cell coupled to a second bit line, said method comprising the steps of:
    isolating the first and second memory cells from transferring a memory charge to the first and second bit lines respectively;
    placing a first reference charge within the first dummy cell;
    transferring the first reference charge from the first dummy cell to the first bit line;
    placing a second reference charge, different from the first reference charge, within the second dummy cell;
    transferring the second reference charge from the second dummy cell to the second bit line;
    sensing a voltage differential appearing between the first bit line and the second bit line and output a signal indicative of the sensed voltage differential; and comparing a logic value of the output signal to an expected logic value to determine the sensitivity of the sense amplifier.

16. The method of claim 15, further comprising the step of independently controlling a magnitude of the first reference charge and independently controlling a magnitude of the second reference charge.

17. The method of claim 16, wherein said step of independently controlling further includes the steps of:
    connecting a first voltage source to a first bond pad coupled to the first dummy cell;
    charging a capacitor within the first dummy cell to the first reference charge using said first voltage source;
    connecting a second voltage source to a second bond pad coupled to the second dummy cell; and
    charging a capacitor within the second dummy cell to the second reference charge using the second voltage source.

18. The method of claim 17, further comprising the steps of turning off a first transistor located between the first dummy cell and the first bond pad and turning off a second transistor located between the second dummy cell and the second bond pad prior to transferring the first reference voltage to the first bit line and transferring the second reference voltage to the second bit line.

19. The method of claim 18, further comprising the steps of controlling a first tristate circuit to electrically connect the first bond pad and the first transistor during the placing of the first reference charge within the first dummy cell, and controlling a second tristate circuit to electrically connect the second transistor and the second bond pad during the placing of the second reference charge within the second dummy cell.

20. The method of claim 18, further comprising the step of controlling a shorting transistor to electrically isolate the first transistor and the second transistor prior to placing the first reference charge within the first dummy cell and placing the second reference charge within the second dummy cell.

21. A method for determining the sensitivity of a sense amplifier located within a dynamic random access memory circuit, said method comprising the steps of:

placing a first reference charge onto a first bit line;

placing a second reference charge onto a second bit line;

sensing a voltage differential appearing between the first bit line and the second bit line; and monitoring at least one input/output signal generated by the sense amplifier in response to sensing the voltage differential to determine the sensitivity of the sense, amplifier.

* * * * *